(12) United States Patent
Ueno et al.

(10) Patent No.: US 6,740,430 B2
(45) Date of Patent: May 25, 2004

(54) ORGANIC LUMINESCENCE DEVICE

(75) Inventors: Kazunori Ueno, Ebina (JP); Koichi Suzuki, Yokohama (JP); Akihiro Senoo, Kawasaki (JP); Hiroshi Tanabe, Yokohama (JP); Seiji Mashimo, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 96 days.

(21) Appl. No.: 10/033,962

(22) Filed: Jan. 3, 2002

(65) Prior Publication Data

US 2002/0090531 A1 Jul. 11, 2002

(30) Foreign Application Priority Data

Jan. 10, 2001 (JP) ........................................ 2001-002223

(51) Int. Cl.$^7$ ............................................... H05B 33/04
(52) U.S. Cl. .................. 428/690; 428/917; 428/76; 313/512; 257/99; 257/100
(58) Field of Search ................................. 428/690, 917, 428/76; 313/512; 257/99, 100

(56) References Cited

U.S. PATENT DOCUMENTS

| 3,227,656 A | 1/1966 | Jeffreys .................... 252/301.2 |
| 5,179,187 A | 1/1993 | Pedain et al. .................. 528/59 |
| 5,882,761 A | 3/1999 | Kawami et al. ............... 428/69 |

FOREIGN PATENT DOCUMENTS

| EP | 0 776 147 A1 | 5/1997 |
| EP | 1 139 698 A2 | 4/2001 |
| EP | 1 137 325 A2 | 9/2001 |
| JP | 60-040116 | * 3/1985 |
| JP | 62-104846 | * 5/1987 | .............. 427/389.7 |
| JP | 3-261091 | 11/1991 |
| JP | 4-32194 | 2/1992 |
| JP | 7-169567 | 7/1995 |
| JP | 9-148066 | 6/1997 |
| JP | 2000-277254 | 10/2000 |
| WO | WO 01/32531 A1 | * 5/2001 |

OTHER PUBLICATIONS

Meyer, Hans–Joachim et al., "Water–Binding Solid Scintillators", (2000), Chemistry–A European Journal 6(15), pp. 2809–2817.*

* cited by examiner

Primary Examiner—Cynthia H. Kelly
Assistant Examiner—Dawn Garrett
(74) Attorney, Agent, or Firm—Fitzpatrick, Cella, Harper & Scinto

(57) ABSTRACT

An organic luminescence device is constituted by an organic luminescence lamination structure comprising a pair of an anode and a cathode, and at least one organic compound layer disposed between the anode and the cathode, a hermetic sealing housing enclosing therein the organic luminescence lamination structure and blocking external air, and a drying agent disposed within the hermetic sealing housing. The drying agent comprises a compound represented by the following formula (1):

$$R-NCO \qquad (1),$$

wherein R denotes a substituted or unsubstituted alkenyl group, a substituted or unsubstituted aryl group, a substituted or unsubstituted styryl group, a substituted or unsubstituted acyl group, or a substituted or unsubstituted heterocyclic group. The drying agent comprises the compound of the formula (1) in a polymerized form.

8 Claims, 1 Drawing Sheet

ORGANIC LUMINESCENCE DEVICE

FIELD OF THE INVENTION AND RELATED ART

The present invention relates to an organic luminescence device having an organic luminescence lamination structure including a fluorescent organic compound layer sandwiched between an anode and a cathode, particularly to an organic luminescence device exhibiting stable luminescence characteristics for a long period of time.

An organic luminescence device generally comprises a pair of an anode (electrode) and a cathode (electrode), and an organic thin film (layer) comprising a fluorescent organic compound disposed between the anode and the cathode. In the organic luminescence device, electrons and holes are injected form the respective electrodes into the fluorescent organic compound layer to generate excitons of the fluorescent organic compound, and the resultant excitons are returned to the ground state to cause luminescence (emission of light). By appropriately changing an organic fluorescent dye, it becomes possible to allow a latitude in conversion of emitted light. Further, the organic luminescence device is a self-emission device, thus exhibiting excellent performances such as a good visibility. As a result, the organic luminescence device is expected to be used as displays for portable or hand-held data terminals and various industrial equipment.

However, the organic luminescence device has been accompanied with such a difficulty that luminescence characteristics are remarkably lowered when the organic luminescence device is driven for a long period of time.

One of factors causing such a lowering in luminescence characteristics may include moisture (or water content) contained within the organic luminescence device. More specifically, moisture present within organic materials used in the organic luminescence device or moisture permeating or entering the organic luminescence device causes peeling-off of a cathode metal material layer, thus resulting in dark spots being defective stops causing electrical conduction failure.

Accordingly, it is necessary to remove moisture present within the organic luminescence device in order to suppress an occurrence of dark spots.

For this purpose, several proposals have been made.

More specifically, Japanese Laid-Open Patent Application (JP-A) 7-169567 discloses an organic luminescence device having a lamination structure comprising a device including an anode, an organic luminescence material layer and a cathode; a protective film containing a drying agent disposed outside the device; and a sealing layer disposed on the protective film.

JP-A 3-261091 disclose an organic luminescence device having a hermetic sealing casing having a sealed hollow space including therein a lamination structure and drying means, wherein the lamination structure comprises a pair of opposing electrodes and an organic luminescence material layer sandwiched between the electrodes, and the drying means comprises phosphorus pentoxide and is disposed apart from the lamination structure in the sealed hollow space.

Further, JP-A 9-148066 discloses an organic luminescence device having a hermetic sealing casing similar to that described in JP-A 3-261091 except for using a drying agent comprising an alkali earth metal oxide (in place of phosphorus pentoxide).

However, the above-mentioned conventional organic luminescence devices have been accompanied with the following problems. Specifically, in the organic luminescence device disclosed in JP-A 7-169567, the cathode is liable to be damaged by formation of the protective film. In the organic luminescence device disclosed in JP-A 3-261091, an adverse influence of phosphoric acid derived from phosphorus pentoxide and moisture has been pointed out. Further, the organic luminescence device disclosed in JP-A 9-148066 involves a toxic effect of some species of metal oxide. (BaO in this case)

SUMMARY OF THE INVENTION

A principal object of the present invention is to provide an organic luminescence device having solved the above-mentioned problems of the conventional organic luminescence devices.

A specific object of the present invention is to provide an organic luminescence device using a drying agent free from an adverse influence on the organic luminescence device and free from toxicity thereby to maintain stable luminescence characteristics for a long period of time and allow a safe organic luminescence device.

According to the present invention, there is provided an organic luminescence device, comprising:

an organic luminescence lamination structure comprising a pair of an anode and a cathode, and at least one organic compound layer disposed between the anode and the cathode, a hermetic sealing housing enclosing therein the organic luminescence lamination structure and blocking external air, and a drying agent disposed within the hermetic sealing housing, wherein the drying agent comprises a compound represented by the following formula (1):

$$R\text{---}NCO \qquad (1),$$

wherein R denotes a substituted or unsubstituted alkenyl group, a substituted or unsubstituted aryl group, a substituted or unsubstituted styryl group, a substituted or unsubstituted acyl group, or a substituted or unsubstituted heterocyclic group.

In the organic luminescence device, the drying agent of the formula (1) may be in a polymerized form or may comprise a mixture comprising the compound of the formula (1), preferably in a polymerized form, and an inorganic compound. Further, in a preferred embodiment, the compound of the formula (1) as the drying agent may be formed on the organic luminescence lamination structure by vacuum (vapor) deposition or coating.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Hereinbelow, the present invention will be described more specifically with reference to FIGS. 1 and 2.

Figure 1:
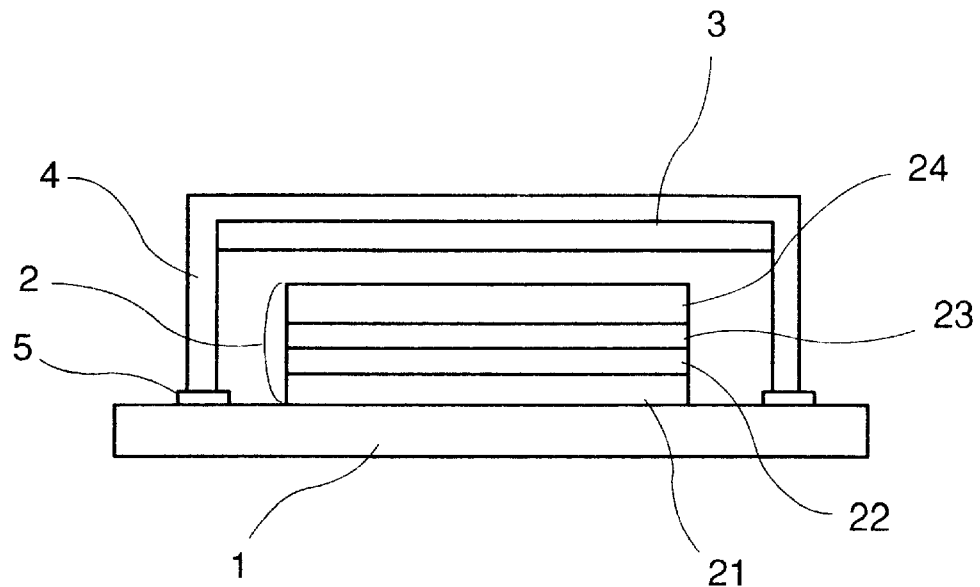
FIG. 1 is a schematic sectional view showing an embodiment of the organic luminescence device according to the present invention.
Figure 2:
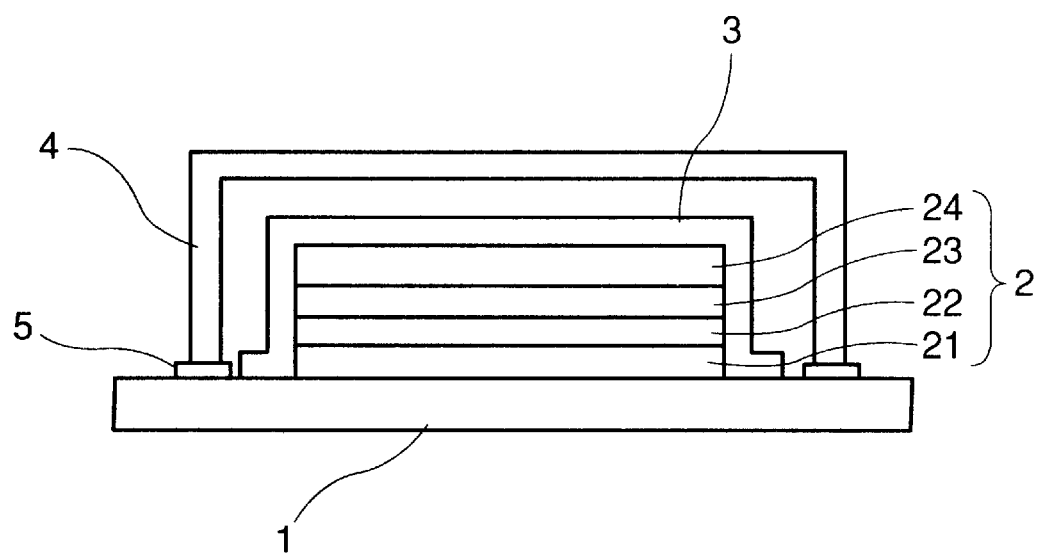
FIG. 2 is a schematic sectional view showing another embodiment of the organic luminescence device of the present invention.

FIGS. 1 and 2 respectively shows an example of a sectional structure of the organic luminescence device of the present invention.

Referring to FIGS. 1 and 2, each organic luminescence device includes a glass substrate 1; an organic luminescence lamination structure 2 comprising a transparent electrode (anode) 21, a hole transport layer 22, a luminescence (and electron transport) layer 23, and a metal electrode (cathode) 24; a drying agent 3; a hermetic sealing housing 4; and an adhesive material 5 for bonding the hermetic sealing housing 4 to the glass substrate 1.

In the organic luminescence device shown in FIG. 1, the drying agent 3 is disposed at an inner surface of the hermetic sealing housing 4 so as to be opposite to the organic luminescence lamination structure 2 with a spacing therebetween. On the other hand, in the organic luminescence device shown in FIG. 2, the drying agent 3 is disposed to directly cover the entire (outer) surface of the organic luminescence lamination structure 2.

In either case, the hermetic sealing housing 4 constitutes a hermetic sealing package together with the glass substrate 1 (and the adhesive 5), and drying inert gas is charged at an inner space of the organic luminescence device.

The drying agent 3 used in the present invention comprises an isocyanate compound represented by the above-mentioned formula (1).

The isocyanate compound irreversibly reacts with moisture (water content) to trap moisture present within the hermetic sealing housing (package).

In the formula (1), as described above, R represents an alkenyl group, an aryl group, styryl group, an acyl group, a heterocyclic group, or substituted groups of these groups.

Examples of the alkenyl group may include vinyl, propenyl, butenyl and those containing aromatic ring. Examples of aryl group may include phenyl biphenyl, naphthyl, anthryl and phenanthryl. Examples of the acyl group may include acryloyl group, methacryloyl group, vinylbenzenecarbonyl group and cinnamoyl group. Examples of heterocyclic group may include pyridyl, quinolyl and perimidinyl.

Examples of substituents for the above groups may include methyl, ethyl, propyl, chloro, alkenyl, alkylene, nitro group, sulfonyl group, amino group, carboxy, carboxymethyl and oxycarbonyl. These substituents may be used singly or in combination of two or more species.

In the formula (1), the isocyanate group (—NCO) may be bonded directly to alkenyl group, aryl group, styryl group, acyl group or heterocyclic group at an appropriate position or bonded to those group via the above-mentioned substituents, such as —CO—, —CO—$(CH_2)_n$—, —$C(CH_3)_2$— and —$SO_2$—.

The isocyanate compound of the formula (1) as the drying agent 3 may preferably be used in a polymerized form or as a mixture comprising an inorganic compound (e.g., CaO, BaO, $P_2O_5$, etc.) and the isocyanate compound of the formula (1), particularly in a polymerized form. The resultant polymerized isocyanate compound of the formula (1) may have a weight-average molecular weight (Mw) of 1,000–100,000, preferably 10,000–50,000.

Specific but non-exhaustive examples of the isocyanate compound of the formula (1) may include those (Example Compound Nos. 1–65) shown below.

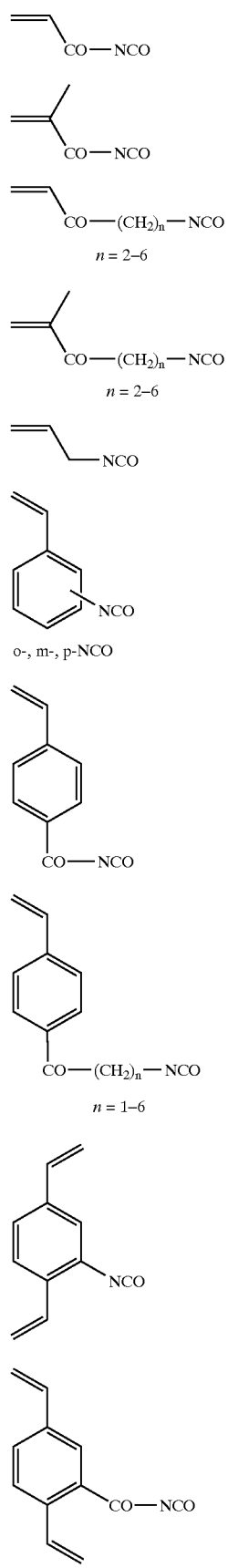

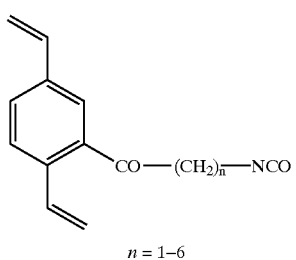
12
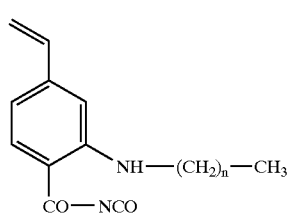
n = 1–6
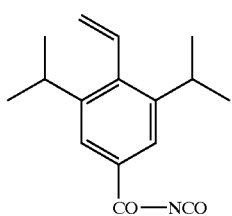
13
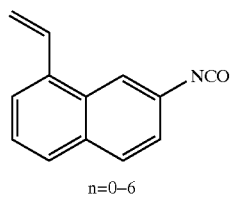
n=0–6
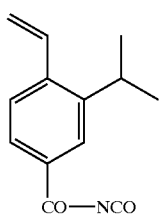
14
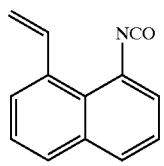
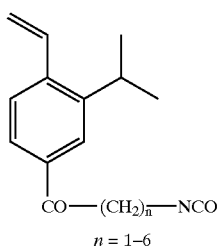
15
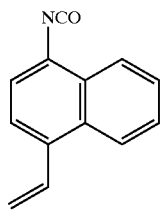
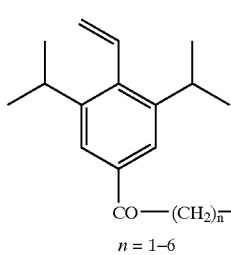
16
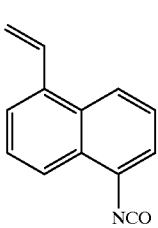
n = 1–6
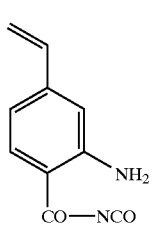
17
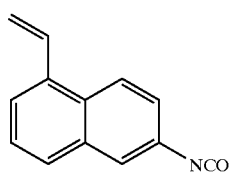
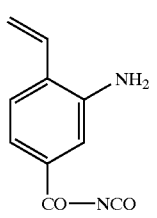
18
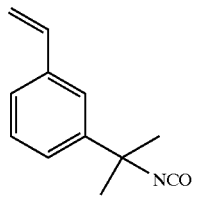

-continued
| | |
|---|---|
| 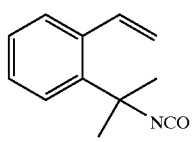 | 27 |
| 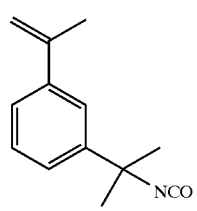 | 28 |
| 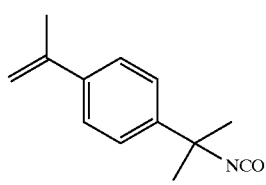 | 29 |
| 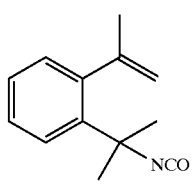 | 30 |
| 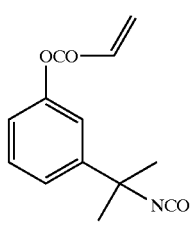 | 31 |
| 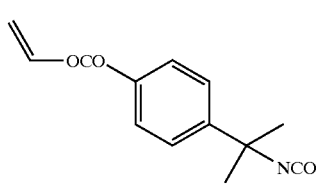 | 32 |
| 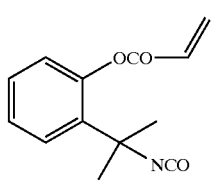 | 33 |
| 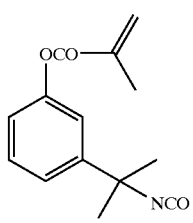 | 34 |
-continued
| | |
|---|---|
| 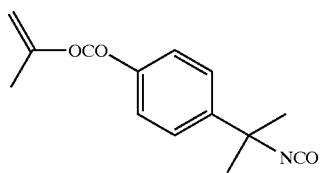 | 35 |
| 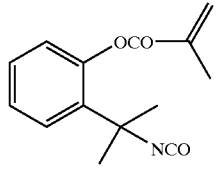 | 36 |
| 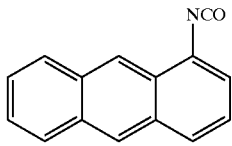 | 37 |
| 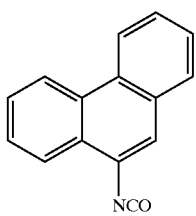 | 38 |
| 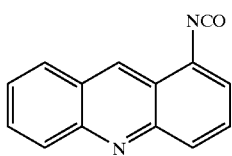 | 39 |
| 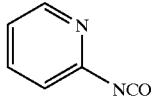 | 40 |
| 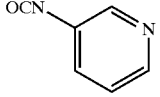 | 41 |
| 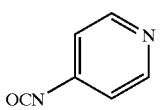 | 42 |
| 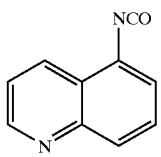 | 43 |
| 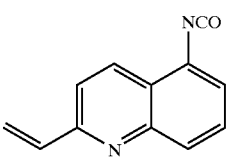 | 44 |

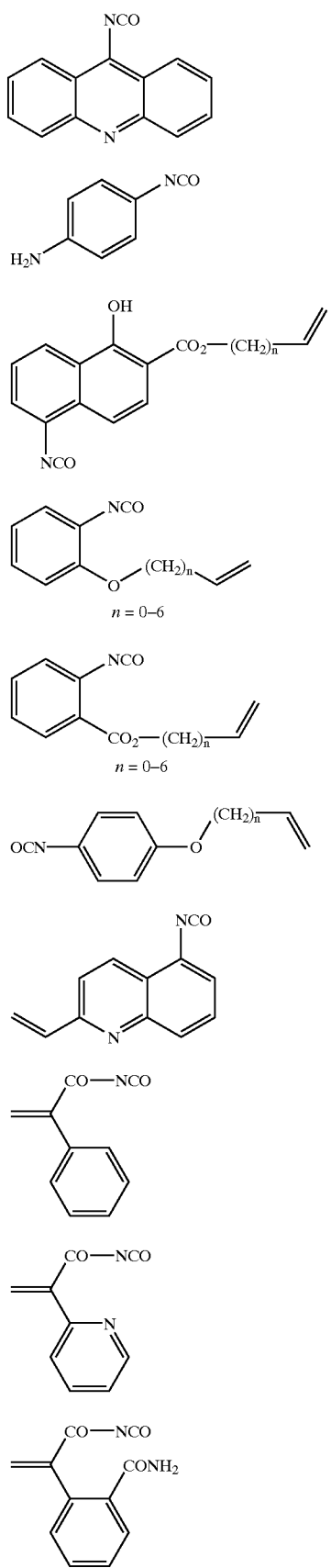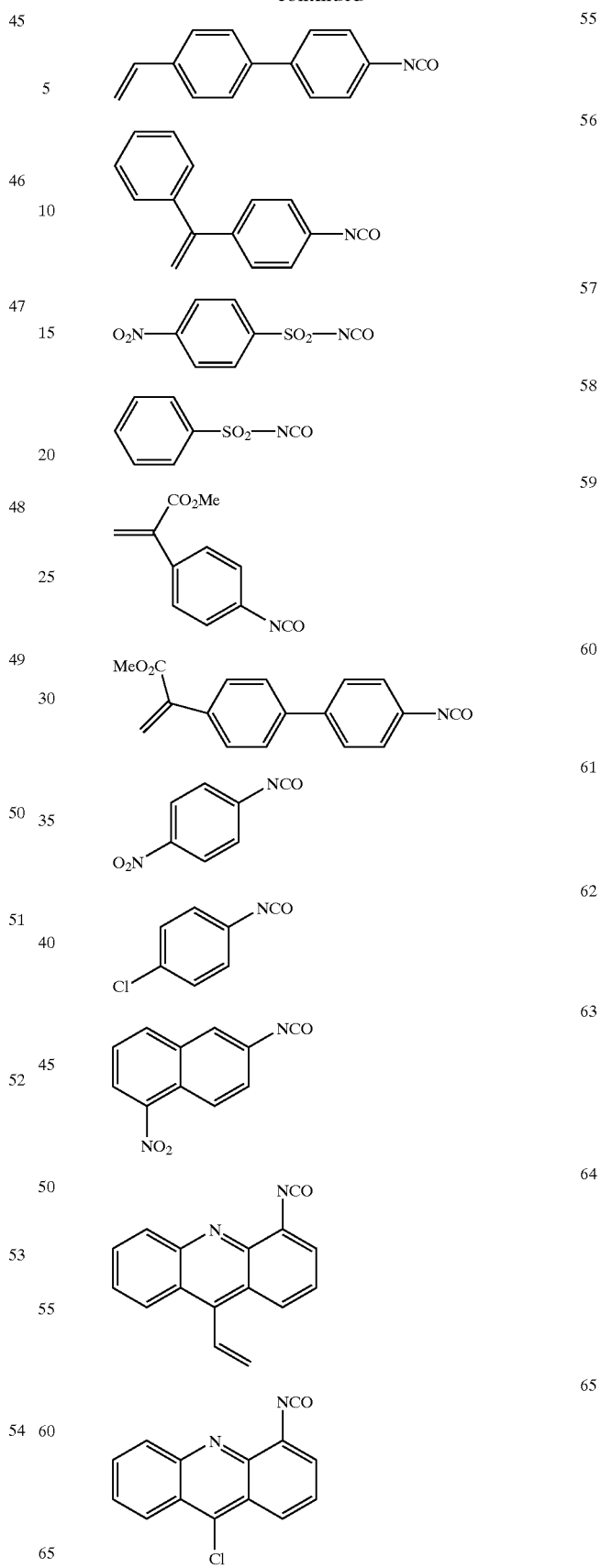

The drying agent 3 may, e.g., be disposed within the organic luminescence device according to the present invention in the following manner.

At an inner surface of the hermetic sealing housing 4 located opposite to an upper surface of the organic luminescence lamination structure 2 as shown in FIG. 1, a layer of the isocyanate compound of the formula (1) may be fixed alone by vacuum deposition, fixed as a composite member with an inorganic compound, or fixed in a form of a film by spin coating and polymerization with an ultraviolet (UV) lamp or under heating. Alternatively, as shown in FIG. 2, a layer of the isocyanate compound of the formula (1) may be formed by vacuum deposition on the organic luminescence lamination structure 2 so as to cover the entire surface thereof or fixed as a composite material with an inorganic compound, optionally followed by polymerization for solidification.

In the present invention, the drying agent 3 may be used in an amount of 1–1000 mg/cm$^2$, preferably 10–100 mg/cm$^2$.

Further, when the drying agent 3 is used as the mixture of the isocyanate compound of the formula (1) with the inorganic compound, the inorganic compound may preferably be used in an amount of 5–30wt. % in the mixture.

Hereinbelow, the present invention will be described more specifically with reference to Examples.

EXAMPLE 1

In this example, an isocyanate compound (Ex. Comp. No. 2) was used in a polymerized form as a drying agent.

An organic luminescence device as shown in FIG. 1 was prepared in the following manner.

On a 1.1 mm thick glass substrate 1 (10×10 mm), a 120 nm-thick transparent electrode (anode) 21 (2×2 mm) of ITO (indium tin oxide) was formed by sputtering.

On the transparent (ITO) electrode 21, a 50 nm-thick hole transport layer 22 of TPD (N,N'-bis(3-methylphenyl)-N,N'-dipheyl-(1,1'-biphenyl)-4,4'-diamine) and a 50 nm-thick electron transport layer (also functioning as luminescence layer) 23 of Alq3 (tris(8-quinolinol)aluminum) were successively formed by vacuum deposition ($2\times10^{-4}$–$3\times10^{-4}$ Pa) at a deposition rate of 0.2–0.3 nm/sec.

Thereafter, on the electron transport layer 23, a 200 nm-thick metal electrode (cathode) 24 of Mg/Ag (=10/1) alloy by co-deposition of Mg and Ag at a deposition speed ratio (Mg:Ag) of 10:1 (pressure: $1.0\times10^{-3}$ Pa, deposition rate: 1 nm/sec).

On an inner surface of hermetic sealing housing 4 of glass, a solution of an isocyanate compound (Ex. Comp. No. 2) in toluene was coated and subjected to UV light irradiation with a xenon lamp (370 nm, 200 mW/cm$^2$, 300 sec) in a nitrogen gas atmosphere to form a 1 μm-thick layer (2×2 mm) of the isocyanate compound in a polymerized form. Then, in a nitrogen gas atmosphere, the hermetic sealing housing 4 and the above-treated glass substrate 1 were bonded to each other via an epoxy adhesive 5 disposed at a peripheral edge of the hermetic sealing housing 4 to prepare a hermetically sealed organic luminescence device.

When the thus-prepared organic luminescence device was supplied with a DC current voltage of 7 volts between the transparent electrode 21 ((+)side) and the metal electrode ((−)side) immediately after the sealing step, a good green luminescence state (initial state) was observed through a microscope (magnification: 50).

Then, the organic luminescence device was left standing for 700 hours in an environment of 60° C. and 90% RH, followed by microscopic observation of a luminescence state under the DC voltage application in a similar manner.

As a result, growth of dark spots was not substantially observed.

EXAMPLE 2

An organic luminescence device as shown in FIG. 1 was prepared and evaluated in the same manner as in Example 1 except that the isocyanate compound (Ex. Comp. No. 2) was changed to an isocyanate compound (Ex. Comp. No. 7, p-NCO) and the sealing step was performed in the following manner.

In a nitrogen gas atmosphere, an isocyanate compound (Ex. Comp. No. 7, p-NCO) was coated at an inner surface of a hermetic sealing housing 4 in the same manner as in Example 1 and a UV-curable adhesive 5 (acrylic resin) was applied at a peripheral edge of the hermetic sealing housing 4, followed by bonding of the hermetic sealing housing 4 to the glass substrate 1 and then UV light irradiation to cure the isocyanate compound and the UV-curable adhesive at the same time thereby to provide a hermetically sealed organic luminescence device.

As a result of evaluation, the organic luminescence device exhibited a good initial green luminescence state and growth of dark spots was not substantially observed similarly as in Example 1.

EXAMPLE 3

An organic luminescence device as shown in FIG. 1 was prepared and evaluated in the same manner as in Example 1 except that the isocyanate compound (Ex. Comp. No. 2) was changed to an isocyanate compound (Ex. Comp. No. 8) and the sealing step was performed in the following manner.

In a nitrogen gas atmosphere, an isocyanate compound (Ex. Comp. No. 8) was coated at an inner surface of a hermetic sealing housing 4 in the same manner as in Example 1 and subjected to heating at 100° C. for 10 minutes to polymerize the isocyanate compound (Ex. Comp. No. 8), followed by bonding of the hermetic sealing housing 4 to the glass substrate 1 in the same manner as in Example 1 to form a hermetically sealed organic luminescence device.

As a result of evaluation, the organic luminescence device exhibited a good initial green luminescence state and growth of dark spots was not substantially observed similarly as in Example 1.

EXAMPLE 4

An organic luminescence device as shown in FIG. 2 was prepared and evaluated in the same manner as in Example 1 except that the isocyanate compound (Ex. Comp. No. 2) was changed to an isocyanate compound (Ex. Comp. No. 37) and the sealing step was performed in the following manner.

In a nitrogen gas atmosphere, an isocyanate compound (Ex. Comp. No. 37) was formed so as to cover a hermetic sealing housing 4 by vacuum deposition and an epoxy adhesive 5 was applied at a peripheral edge of the hermetic sealing housing 4, followed by bonding of the hermetic sealing housing 4 to the glass substrate 1 to form a hermetically sealed organic luminescence device.

As a result of evaluation, the organic luminescence device exhibited a good initial green luminescence state and growth of dark spots was not substantially observed.

EXAMPLE 5

An organic luminescence device as shown in FIG. 1 was prepared and evaluated in the same manner as in Example 1 except that the isocyanate compound (Ex. Comp. No. 2) was changed to an isocyanate compound (Ex. Comp. No. 59) with CaO and the sealing step was performed in the following manner.

In a nitrogen gas atmosphere, a mixture of an isocyanate compound (Ex. Comp. No. 59) with CaO (20 wt. %) was coated at an inner surface of a hermetic sealing housing 4 in the same manner as in Example 1 and an epoxy adhesive 5 was applied at a peripheral edge of the hermetic sealing housing 4, followed by bonding of the hermetic sealing housing 4 to the glass substrate 1 and then UV light irradiation to occur the isocyanate compound to form a hermetically sealed organic luminescence device.

As a result of evaluation, the organic luminescence device exhibited a good initial green luminescence state and growth of dark spots was not substantially observed similarly as in Example 1.

In this example, the inorganic compound (CaO in this case) which had been conventionally enclosed, e.g., in a space between the hermetic sealing housing 4 and an air-permeable sealing member so as not to directly contact the organic luminescence lamination structure was readily fixed to the hermetic sealing housing 4 by mixing it with the isocyanate compound of the formula (1) without impairing water (moisture) absorption properties of the inorganic compound As described above, according to the present invention, by using the isocyanate compound of the formula (1) as the drying agent it becomes possible to stably retain the driving agent in a solid or solidified state even after water absorption, thus not adversely affecting the resultant organic luminescence device. Further, the organic luminescence device is free from a toxicity problem to obviate an adverse influence on human body when the organic luminescence device is broken. As a result, it is possible to provide a safe organic luminescence device capable of maintaining stable luminescence characteristics for a long period of time.

What is claimed is:

1. An organic luminescence device, comprising:
    an organic luminescence lamination structure comprising a pair of an anode and a cathode, and at least one organic compound layer disposed between the anode and the cathode,
    a hermetic sealing housing enclosing therein the organic luminescence lamination structure and blocking external air, and
    a drying agent disposed within the hermetic sealing housing, wherein
    the drying agent comprises a compound represented by the following formula (1):

$$R-NCO \qquad (1),$$

wherein R denotes a substituted or unsubstituted alkenyl group, a substituted or unsubstituted aryl group, a substituted or unsubstituted styryl group, a substituted or unsubstituted acyl group, or a substituted or unsubstituted heterocyclic group.

2. A device according to claim 1, wherein the drying agent comprises the compound of the formula (1) in a polymerized form.

3. A device according to claim 1, wherein the drying agent comprises a mixture comprising the compound of the formula (1) and an inorganic compound.

4. A device according to claim 1, wherein the drying agent comprises a mixture comprising the compound of the formula (1) in a polymerized form and an inorganic compound.

5. A device according to claim 1, wherein the compound of the formula (1) is disposed on the organic luminescence lamination structure by vacuum deposition or coating.

6. A device according to claim 1, wherein the drying agent covers the organic luminescence lamination structure.

7. A device according to claim 6, further comprising a substrate having a supporting surface, wherein the organic luminescence lamination structure is disposed on the supporting surface, and wherein the drying agent covers a part of the supporting surface.

8. A device according to claim 6, further comprising a substrate having a supporting surface, wherein the organic luminescence lamination structure is disposed on the supporting surface, and wherein the drying agent is not disposed on the hermetic sealing housing.

* * * * *